United States Patent [19]
Reid et al.

[11] 3,991,346
[45] Nov. 9, 1976

[54] REINFORCED BACKPLANE FOR HIGH DENSITY ELECTRICAL CONTACTS

[75] Inventors: Gilbert R. Reid, Norristown; Robert B. Snow, King of Prussia, both of Pa.

[73] Assignee: Burroughs Corporation, Detroit, Mich.

[22] Filed: Dec. 23, 1974

[21] Appl. No.: 536,975

[52] U.S. Cl.................... 317/100; 317/101 DH; 339/17 LC; 339/198 S
[51] Int. Cl.²........................................ H02B 1/00
[58] Field of Search....... 339/176 M, 176 MP, 17 L, 339/17 LM, 17 M, 17 LC, 198 H, 198 S; 317/101 DH

[56] References Cited
UNITED STATES PATENTS

| | | | |
|---|---|---|---|
| 3,086,074 | 4/1963 | Just et al. | 339/198 S |
| 3,136,591 | 6/1964 | Just et al. | 339/176 M |
| 3,166,372 | 1/1965 | Just | 339/17 LM |
| 3,368,117 | 2/1968 | Pond et al. | 317/101 DH |

*Primary Examiner*—David Smith, Jr.
*Attorney, Agent, or Firm*—K. R. Peterson; E. M. Chung; F. A. Varallo

[57] ABSTRACT

In accordance with the present disclosure, the conventional metal backplane utilized for mounting and interconnecting electronic components is reinforced to increase its rigidity and permit its acceptance of a large number of closely spaced electrical contacts without excessive deformation when accepting the mating contacts. Such reinforcement is achieved in a manner which does not sacrifice the obstruction free area on the backplane required for terminal interconnection as might be performed by wire wrap techniques or a printed circuit backplane.

10 Claims, 3 Drawing Figures

REINFORCED BACKPLANE FOR HIGH DENSITY ELECTRICAL CONTACTS

BACKGROUND OF THE INVENTION

Present day packaging of electronic equipment makes use of a metal plate which serves as a backplane for mounting and interconnecting components or component subassemblies. In particular such techniques are utilized in the computer field where high density packaging is requisite. In connection with the mounting of large numbers of closely spaced electrical contacts in the metal backplane, solderless wire wrapping of the terminals for interconnections is often used. With the growing size and complexity of the electronic equipment, increasingly large numbers of electrical contacts are required to be mounted in a single span of metal backplane connections. It has been found that when the standard 0.080 inch aluminum backplane was used with the well known fork contacts, the forks being mounted on 0.100 centers, and having an array of approximately 4 rows of contacts each having about 60 contacts end-to-end, the pressure from the mating blade contacts caused a significant bow in the backplane. At the center of the row, the bow in the plate is at a maximum and results in an insufficient mating depth for the contacts. The present invention alleviates this problem, expands the number of contacts which may be placed end-to-end and hence the total number of contacts, and at the same time does not place any obstructions in the area of the wiring interconnections.

SUMMARY OF THE INVENTION

In accordance with the present invention, a metal plate used as a backplane for interconnecting electronic components, is formed with, or has affixed thereto, at least one, but generally a plurality of rib-like members. The ribs may be formed on the plate by any of several well known operations, such as machining, casting or extruding. On the other hand, the rib may be welded or be otherwise suitably fastened or attached to an existing metal plate. These members project outward from one of the plate surfaces and may be arranged to traverse the plate in spaced-apart parallel relationship. Large numbers of modular electrical contact elements fitted with insulators are mounted in the metal plate and arranged on both sides of a rib member to form a receptacle connector body.

The receptacle contacts are accessible from the surface of the plate having the rib-like members, and are adapted to mate with a plug connector body which may also be modular in form. The terminal portions of the receptacle which are used for wiring interconnections appear adjacent the opposite surface of the plate which is a plane surface, having no physical obstructions. The mating of the contact elements requires a force which is a direct function of the number of contacts in the plug and receptacle. For minitiature fork and blade contacts, this force may be on the order of 2.5 to 4 ounces per contact. In the absence of the rigid backplane provided by the present invention, the engagement of a large number of rows of contacts, placed in line and extending about three inches in length, caused severe bowing of the standard aluminum 0.080 inch plate. In contrast, incorporation of the present invention into an actual operating system has enabled the use of groups of 240 contacts, in four rows of 60 contacts each, placed on 0.100 inch centers with no appreciable deformation of the backplane.

Approximately 60 pounds of force are exerted upon a 6 inch long strip of the aluminum backplane upon the engagement of the 240 contacts. In the absence of the backplane reinforcing rib, the deflection or bow at the center of the 6 inch strip is approximately 0.06 inches. This distance is too great for the proper mating of the contacts.

In accordance with the invention, the receptacle contacts are arranged in rows on either side of the rib such that the rows are parallel to the rib longitudinal axis and are in proximity to the rib. The like directions of the rib and the rows of receptacle contacts are significant in that, it is only in this manner that the plate reinforcing properties of the rib are brought to bear upon reducing backplane deflections along the strip occupied by the receptacle contacts. In actual operation, a rib extending outward about 0.3 inch from the surface of the backplane, reduced the maximum deflection (in the case of the 240 contacts) to about 0.01 inches, which is nondetrimental to contact engagement.

Other features of the present invention, including increased heat-sink activity and a convenient plug-to-receptacle keying means, will become apparent in the detailed description of the invention which follows.

DESCRIPTION OF THE PREFERRED EMBODIMENT

Figure 1:
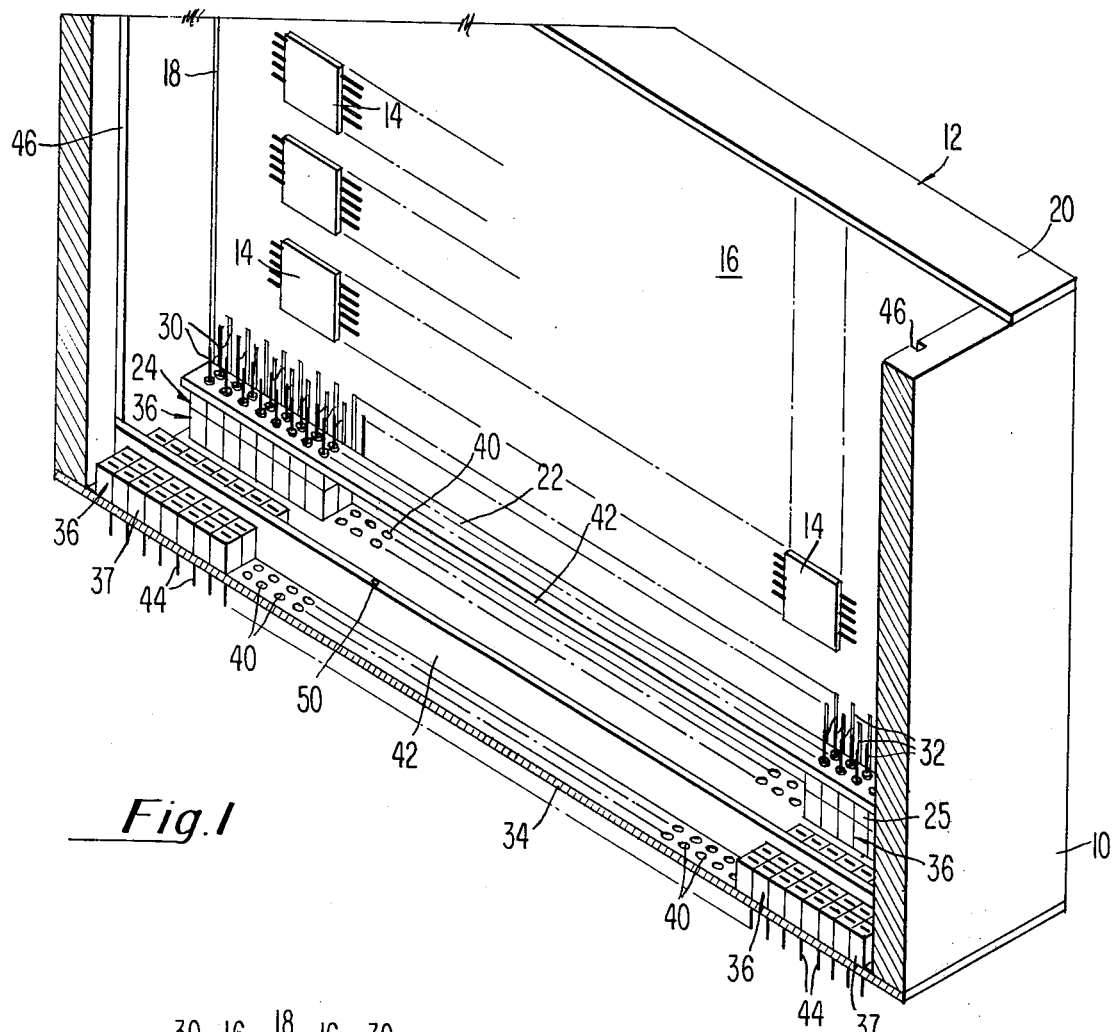
FIG. 1 is a pictorial illustration of a backplane reinforced in the manner contemplated by the invention and shown with modular receptacle and plug contact assemblies.

It is believed that the present invention will be best appreciated when considered in an electronic packaging environment in which it has particular utility. FIG. 1 illustrates in somewhat simplified form such an environment, although it should be understood that the invention is not limited thereto.

With reference to FIG. 1, a partial pictorial view is presented of an enclosure 10 adapted to house a plurality of pluggable electronic submodules, one of which 12 is shown. The electronic components, depicted as flat packs 14 are mounted on multi-layered printed circuit boards 16 which are in turn affixed to either one or both sides of the metallic, usually aluminum or aluminum alloy, heat sink member 18. Interconnection of flat packs 14 is accomplished by means of the printed circuit boards. The heat sink member 18 is formed into an H-section configuration by integral transverse top and base members 20 and 22 respectively. As seen particularly in FIG. 2, a plurality of modular connectors 24 which are comprised of bushings of insulative material 25 containing metal blade type contacts 26 are mounted side by side in holes 28 drilled or punched in the base 22. In an actual operative embodiment 240 connector modules having blade contacts 26 are press fitted into the base member 22, two rows of 60 contacts each, on each side of the heat sink 18. The wire leads 30 on the opposite side of the conectors 24 are soldered or otherwise fastened to the printed circuit pads 32.

Figure 2:
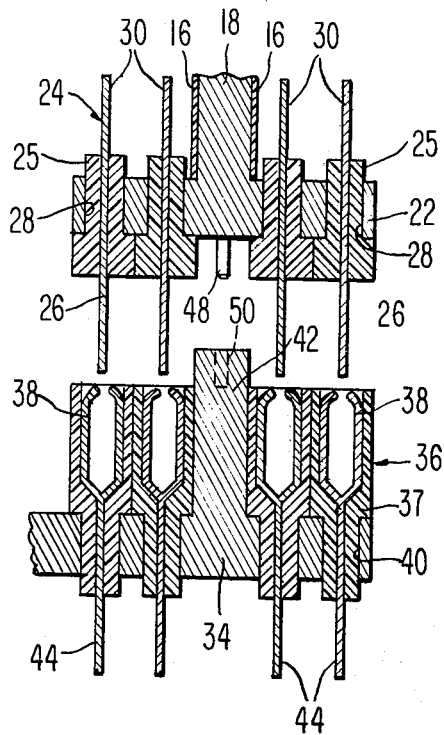
FIG. 2 is a section view taken through the modular contact elements to illustrate their respective mountings in the backplane and plug base member, and their positions prior to engagement.

With continued reference to FIG. 1 and as seen in greater detail in FIG. 2, the aluminum plate 34 which serves as a backplane has a plurality of connector modules 36 similar to those previously described but having instead fork type contacts 38 within insulators 37. These are mounted in holes 40 in the plate surface. Rib-like members 42 of generally rectangular cross-section project outward from the plate 34 surface and traverse the latter in substantially parallel lines. It is these members which provide the needed backplane rigidity for high density contact applications.

The tails or terminals 44 of connectors 36 appearing on the reverse side of plate 34 are used for interconnection and for signal and power distribution. In the case of the embodiment mentioned hereinbefore, 240 connectors having fork-type contacts 38 are mounted in the metal backplane 34, two rows of 60 contacts each, on each side of a rib member 42.

The blade and fork contacts 26 and 38 respectively shown in FIG. 2 appear as they would just prior to their engagement or mating.

Figure 3:
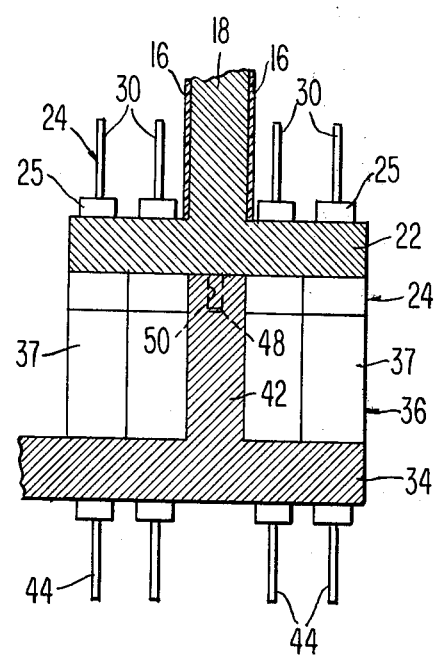
FIG. 3 is another section view taken through the mounted modular contact assemblies in an engaged position, to better illustrate their relationship to the rib-like reinforcing member of the backplane.

In FIG. 1 the contacts 26 and 38 associated with submodule 12 are shown completely engaged, and this condition is better seen in FIG. 3, where a section view has been taken, not through the metallic portion of the contact elements as in FIG. 2, but between the insulative jackets 25 and 37 of adjacent modules in connectors 24 and 36 respectively. It should be noted in FIG. 1 that the submodule which might normally occupy the forward portion of the enclosure 10 as shown, has been omitted to better show the positioning of the rows of fork type connector modules 36 on either side of the rib member 42.

Also, the slots 46, adapted to receive the outer edges of the heat sink 18 and which serve to support the submodule and guide its contacts into engagement with homologous contacts in the backplane 34 are also visible in FIG. 1. The base member 22 of the submodule may be fitted with one or more pins 48, adapted to serve as keying means and to be inserted into holes 50 in the rib member 42. The close juxtaposition of the base 22 and the rib member 42 upon full engagement of the connector contacts, results in making the large metallic mass of the backplane 34 part of the heat sink activity.

The inventive concepts and implementations described herein have proved highly satisfactory in an actual operative system. It should be understood that changes and modifications of the invention may be needed to suit particular requirements. Such changes and modifications insofar as they are not departures from the true scope of the invention, are intended to be covered by the claims appended hereto.

What is claimed is:

1. A rigid backplane comprising in combination:
a metal plate,
a plurality of electrical connectors mounted in proximity to one another on said plate to form at least one row, each of said connectors having a metal contact accessible from a given surface of said plate and adapted to engage a mating contact, said metal plate having at least one rib-like member projecting outward from said given surface, said row of electrical connectors being positioned in parallel with the longitudinal axis of said rib-like member and being in proximity to said member, said rib-like member reinforcing said metal plate in the area occupied by said row of connectors and preventing the substantial deformation of said plate by the force exerted thereon during the engagement of the connector contacts with the mating contacts.

2. A rigid backplane as defined in claim 1 wherein said electrical connectors are modular in character, and are individually mounted in holes in said plate, said connectors being arranged in a plurality of rows, respective ones of said rows being situated on opposite sides of said rib-like member.

3. A rigid backplane as defined in claim 1 wherein said rib-like member is rectangular in cross section and formed from the same material as said plate.

4. A rigid backplane as defined in claim 1 wherein said metal plate has a plurality of rib-like members situated in parallel spaced apart relationship and traversing a given surface of said plate.

5. A rigid backplane for use with at least a single electronic submodule having a metal heat sink member for supporting on either side thereof printed circuit boards with their electrical components and having an integral metal base member with a plurality of plug contacts mounted in rows therein comprising:
a metal plate,
a plurality of receptacle contacts mounted in rows in said plate and being accessible from a given surface thereof to engage said plug contacts,
said plate having at least one rib member extending outward from said given surface thereof, respective ones of said rows of receptacle contacts being positioned on either side of said rib member in proximity thereto and in parallel relationship with the longitudinal axis of said rib, said rib member reinforcing said metal plate in the area occupied by said rows of receptacle contacts and preventing the substantial bowing of said plate by the force exerted thereon during engagement of said contacts.

6. A rigid backplane as defined in claim 5 further characterized in that said rib member is rectangular in cross section and is formed from the material of said plate.

7. A rigid backplane as defined in claim 6 wherein a planar surface of said rib member is contiguous with a planar surface of said base member during engagement of said contacts, said contiguous surfaces contributing to increased heat sink activity for said submodule.

8. A rigid backplane as defined in claim 7 wherein said base member includes at least one keying pin, said rib member having an aperture therein for receiving said pin.

9. A rigid backplane as defined in claim 7 characterized in that said plate includes a plurality of rib members, positioned in parallel spaced-apart relationship and traversing a given surface thereof, each of said members being associated with one of said submodules.

10. A rigid backplane as defined in claim 7 wherein the plug and receptacle contacts are of the blade and fork type respectively.

* * * * *